United States Patent [19]

Hendrix et al.

[11] Patent Number: 5,896,272
[45] Date of Patent: Apr. 20, 1999

[54] CIRCUIT BOARD ENCLOSURE HAVING HEAT TRANSFER CIRCUIT BOARD SUPPORT

[75] Inventors: Walter M. Hendrix, Richardson; Babi Ati, Plano; Michael Guy, Garland, all of Tex.

[73] Assignee: Fujitsu Network Communications, Inc., Richardson, Tex.

[21] Appl. No.: 08/928,723

[22] Filed: Sep. 12, 1997

Related U.S. Application Data

[60] Provisional application No. 60/026,014, Sep. 12, 1996.
[51] Int. Cl.⁶ ..................................................... H05K 7/20
[52] U.S. Cl. .......................... 361/704; 361/700; 361/690; 361/719; 361/802; 165/80.3; 165/185; 165/104.33; 174/35 MS
[58] Field of Search .......................... 361/687, 690–697, 361/698, 700–713, 720, 721, 802, 683, 813; 206/70.8; 165/104.33, 104.34, 185, 80.3, 80.2, 104.32; 174/16.3, 35 MS; 428/36.3; 257/713–715

[56] References Cited

U.S. PATENT DOCUMENTS 3,631,325 12/1971 Wenz et al. ........................ 317/100
3,909,679 9/1975 Petri ................................... 317/100
4,506,785 3/1985 Seefeldt .............................. 206/334
5,309,315 5/1994 Naedel et al. ...................... 361/704
5,424,913 6/1995 Swindler ............................. 361/687

Primary Examiner—Leo P. Picard
Assistant Examiner—Michael Datskovsky
Attorney, Agent, or Firm—Staas & Halsey

[57] ABSTRACT

A circuit board enclosure for housing a plurality of circuit boards has a polymer casing having upper and lower openings and an interior. The circuit board enclosure also has upper and lower heat conductive pieces formed of a metal and fitting respectively within the upper and lower openings in the casing, in a water tight sealed relationship with the casing. The upper and lower heat conductive pieces have heat transfer fins protruding from the openings in the casing. The upper and lower heat conductive pieces have an interior side facing the interior of the enclosure. The interior sides have guide grooves to receive opposing sides of the circuit board. The guide grooves of the upper and lower heat conductive pieces are substantially parallel. The polymer casing may be formed of polycarbonate. The upper and lower heat conductive pieces may be formed of aluminum. The casing may have two upper and two lower holes, with each heat conductive piece having two sets of heat transfer fins fitting respectively through the two holes in the casing.

12 Claims, 5 Drawing Sheets

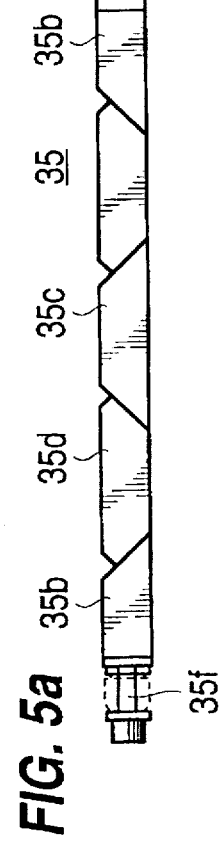
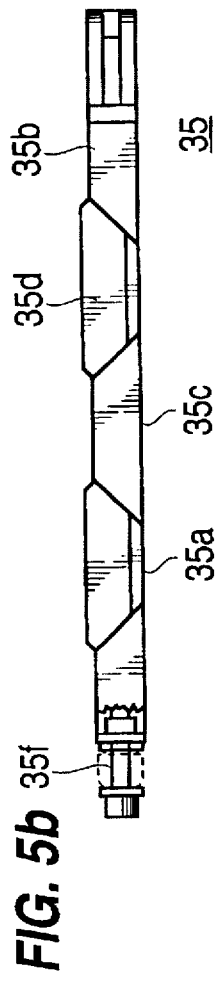
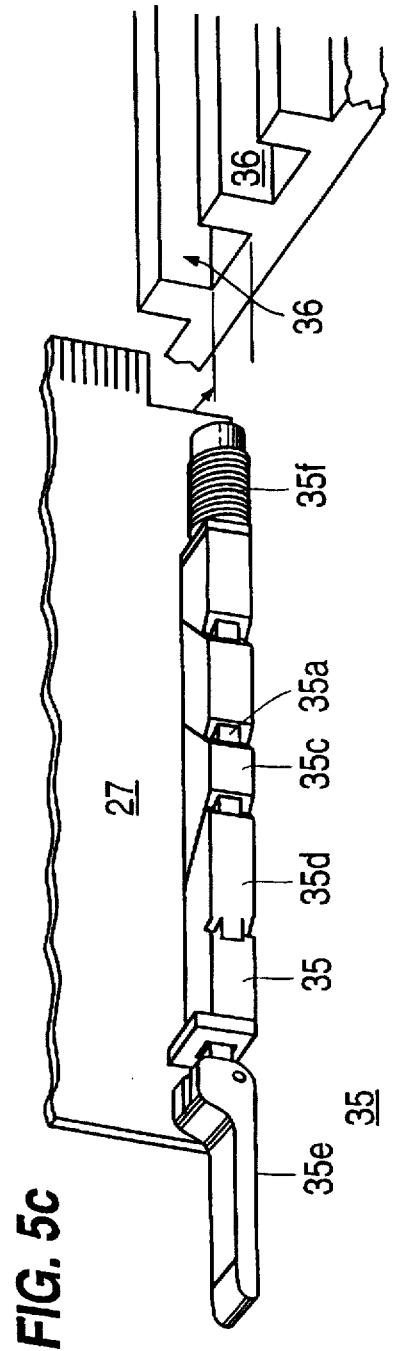

CIRCUIT BOARD ENCLOSURE HAVING HEAT TRANSFER CIRCUIT BOARD SUPPORT

CROSS-REFERENCE TO RELATED APPLICATIONS

This application claims the benefit of the provisional application filed Sep. 12, 1996 entitled COOLING DESIGN OF A SEALED OPTICAL NETWORK UNIT ENCLOSURE having a Ser. No. 60/026,014, the contents of which are hereby incorporated by reference.

BACKGROUND OF THE INVENTION

1. Field of the Invention

The present invention relates in general to an equipment enclosure. More specifically, the present invention relates to heat transfer from an equipment enclosure housing a plurality of circuit boards.

2. Description of the Related Art

To provide consumers with increased bandwidth for transmitting and receiving telecommunications information, fiber in the loop (FITL) networks have been developed. With these networks, optical fiber carries digital information to a location close (perhaps within 1000') to the consumer. In this manner, the information does not travel far over conventional copper wiring, and signal degradation is less of a problem. The optical fiber may carry both conventional telephone traffic and broadband services, such as video on demand, teleconferencing, high speed internet access, etc. In fiber in the loop networks, optical network units receive digital optical signals from fiber optic cable, perform optical-to-electric (and electric-to-optical) conversion and distribute digital electric signals to the consumers.

The optical network units are to house printed circuit boards, and the components thereon generate heat. The circuitry is very sensitive to moisture and other environmental conditions. Thus, the circuit boards must be housed in an enclosure which dissipates heat and is water tight. Furthermore, because the radius of distribution of the optical network unit is relatively small, fiber in the loop networks require many optical network units. For this reason and because the optical network units must be very reliable, active heat transfer components, which require maintenance, cannot be used.

In use, the optical network units may be positioned on the ground or on utility poles. Therefore, small size and light weight are also desirable.

SUMMARY OF THE INVENTION

In developing the present invention, it was proposed to enclose circuit boards in a one piece, all aluminum enclosure. More specifically, it was proposed to have a one piece aluminum enclosure having cooling fins on an exterior and having slots (or guide grooves) for circuit board mounting on an interior. The slots would be opposite to the cooling fins. However, the aluminum enclosure was formed by die-casting with a mold. To remove the enclosure from the mold, the overall size of the enclosure had to increase slightly or taper from the back of the enclosure to the front of the enclosure, a feature known as "tooling air." The circuit boards which were to fit in slots in the enclosure could not fit therein because of the uneven size or taper. Even if the size of the aluminum enclosure did not have to increase from the back of the enclosure to the front of the enclosure, problems would remain associated with the tolerances inherent in an aluminum die casting. These problems could be alleviated by making the aluminum enclosure larger and mounting the circuit boards in a structure interior to and separate from the aluminum enclosure. However, in this case the circuit boards would not be immediately adjacent to the material from which cooling fins were formed. An air gap would detract from heat transfer. Furthermore, as mentioned above, the size was increased.

Accordingly, it is an objection of the present invention to provide an equipment enclosure which can house electronic circuitry in a water tight environment.

It is a further object of the present invention to provide an equipment enclosure that can dissipate heat generated by circuitry stored therein.

It is yet another object of the present invention to provide an equipment enclosure that can dissipate heat using maintenance free components.

It is still further object of the present invention to provide an equipment enclosure that is light weight and small.

To achieve the objects of the invention while avoiding the problems associated with an all aluminum enclosure, the present invention provides a circuit board enclosure for housing a plurality of circuit boards. The circuit board enclosure has a polymer casing having upper and lower openings and an interior. The circuit board enclosure also has upper and lower heat conductive pieces formed of a metal and fitting respectively within the upper and lower openings in the casing, in a water tight sealed relationship with the casing. The upper and lower heat conductive pieces have heat transfer fins protruding from the openings in the casing. The upper and lower heat conductive pieces have an interior side facing the interior of the enclosure. The interior sides have guide grooves to receive opposing sides of the circuit board. The guide grooves of the upper and lower heat conductive pieces are substantially parallel. The polymer casing may be formed of polycarbonate. The upper and lower heat conductive pieces may be formed of aluminum. The casing may have two upper and two lower holes, with each heat conductive piece having two sets of heat transfer fins fitting respectively through the two holes in the casing.

The upper and lower heat conductive pieces may have a widened groove having a width wider than that of the guide grooves. In this case, a high duty circuit board fits within the guide grooves in the upper and lower heat conductive pieces and a thermal plane extends parallel to the high duty circuit board. The thermal plane fits into the wider grooves. Thermal connectors extend from the high duty circuit board to the thermal plane. Thermal clamps are attached to the thermal plane to fit in the widened grooves together with the thermal plane. The thermal clamps have an expandable locking mechanism to secure the thermal plane against the widened groove, and optimize the transfer of heat from the high duty circuit board to the upper and lower conductive pieces.

BRIEF DESCRIPTION OF THE DRAWINGS

The invention will be readily understood by reference to the following description of specific embodiments described by way of example only, with reference to the accompanying drawings, wherein:

FIG. 1b is a front view of the assembly shown in FIG. 1a;

FIG. 1c is a back view of the assembly shown in FIG. 1a;

FIG. 5a is a side view of a thermal clamp used with the equipment enclosure of the present invention, showing the thermal clamp in an open position;

FIG. 5b is a side view of the thermal clamp shown in FIG. 4a, showing the thermal clamp in a closed position; and FIG. 5c is a perspective view of the thermal clamp shown in FIG. 5a, showing how the thermal clamp is attached to a thermal plane shown in FIG. 4.

DETAILED DESCRIPTION OF THE PREFERRED EMBODIMENTS

Figure 1A:
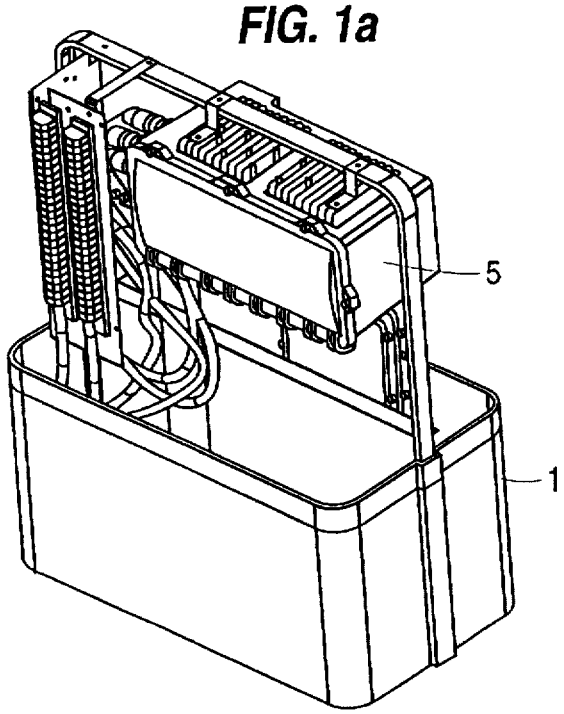
FIG. 1a is a perspective view of an assembly in which an equipment enclosure according to preferred embodiment of the present invention may be used.
Figure 1B:
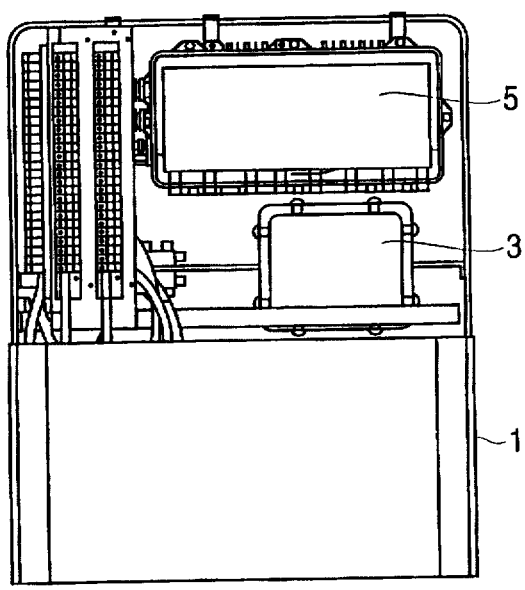
Figure 1C:
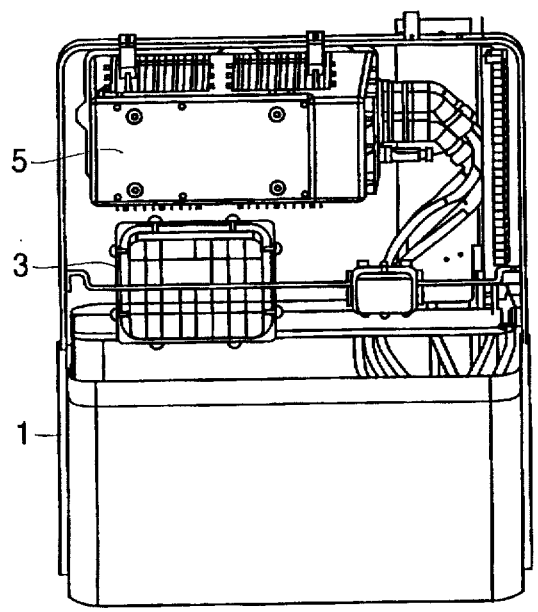

FIG. 1a is a perspective view of an assembly including an equipment enclosure of the present invention. FIGS. 1b and 1c are respectively front and back views of the assembly shown in FIG. 1a. The assembly of FIGS. 1a–1c includes a base 1. The base would be at least partially buried in the ground. Above the base 1 is a power unit 3 which converts high voltage AC current to lower voltage DC current, the voltage depending upon the application. The power unit 3 supplies power to the equipment enclosure 5 of the present invention. As can be seen from FIG. 1a, the equipment enclosure 5 may be supported from above. FIGS 1a–1c show the various interconnections to and from the enclosure 5.

It should be noted that the assembly shown in FIGS. 1a–1c would normally be covered to prevent vandalism to the components thereof and prevent injury.

Figure 2:
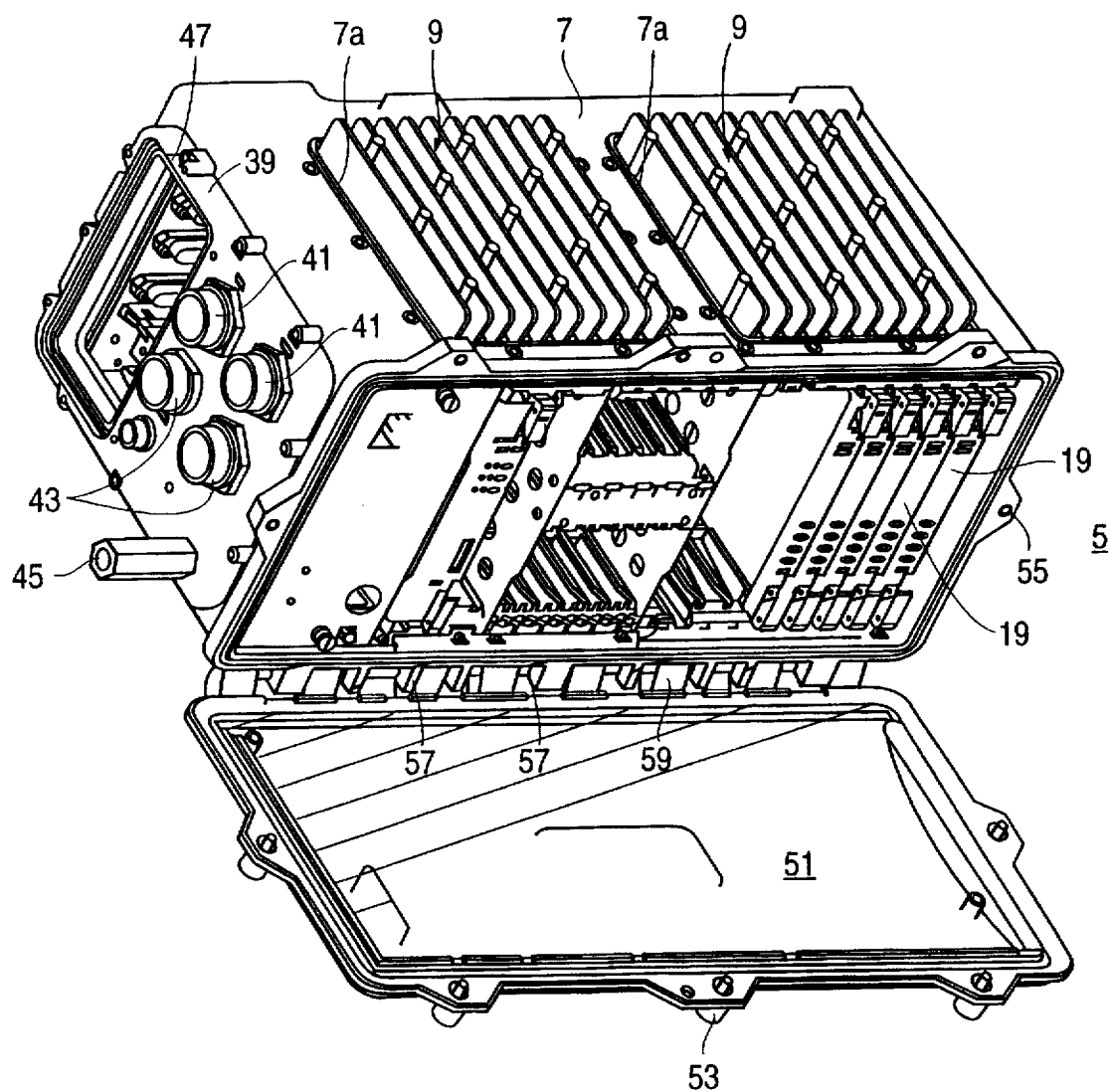
FIG. 2 is a left perspective view of an equipment enclosure according to a preferred embodiment of the present invention.
Figure 3:
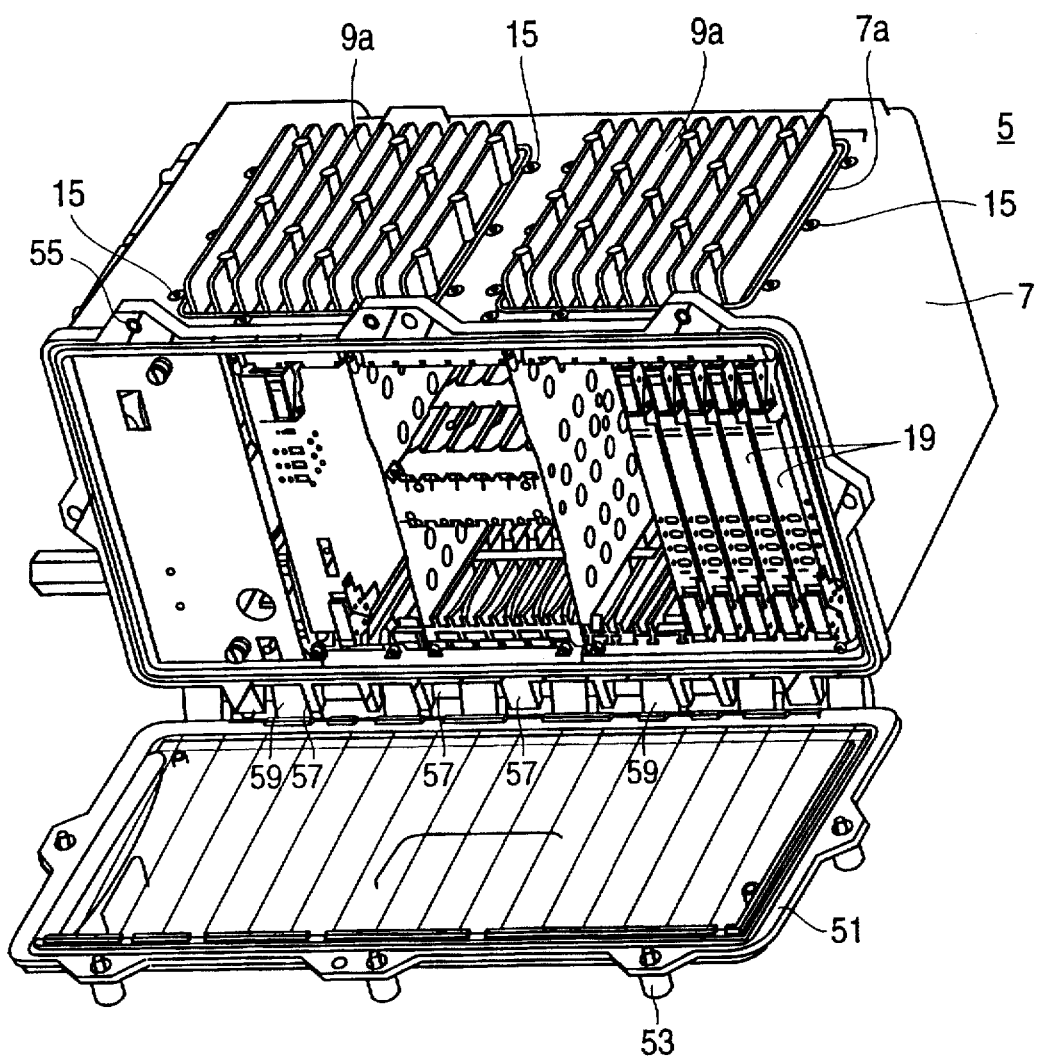
FIG. 3 is a right perspective view of the equipment enclosure shown in FIG. 2.
Figure 4:
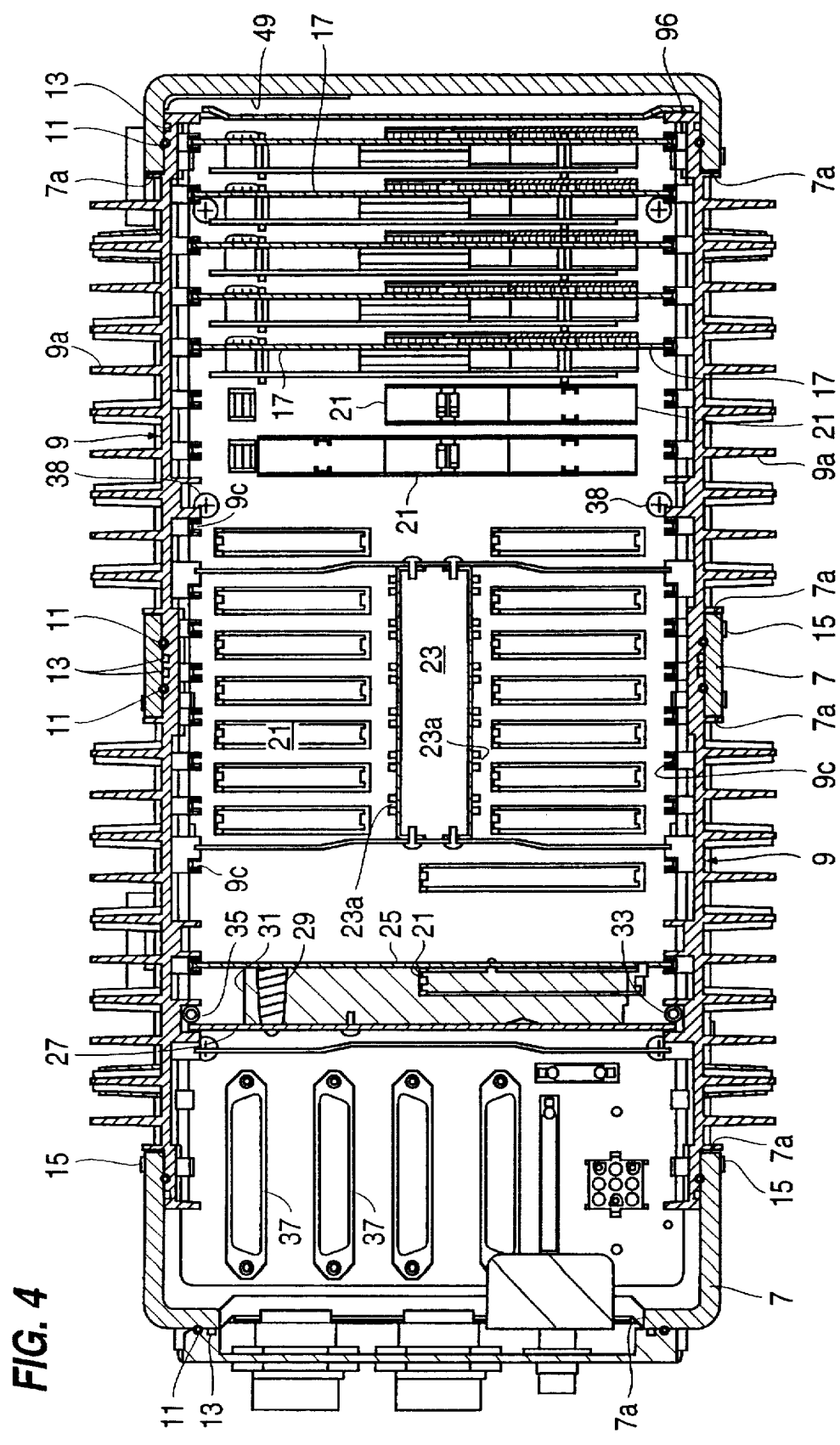
FIG. 4 is a cross sectional view taken through a plane parallel to a door of the equipment enclosure shown in FIG. 2, through a middle of the enclosure.

The components shown in the assembly of FIGS. 1a–1c can also be mounted on a utility pole. In this case, there would be no base 1 and the components would be separately mounted, outside an assembly, on the utility pole typically on an aerial strand wire. FIGS. 2 and 3 are left and right perspective views, respectively of the equipment enclosure of the present invention. FIG. 4 is a cross sectional view taken along a plane parallel to a door of the equipment enclosure. Referring to FIGS. 2–4, the equipment enclosure 5 has a polymer shell 7. The polymer shell may be formed of plastic polycarbonate by an injection molding process. The polymer shell 7 has two holes 7a in a top thereof and two holes 7a in a bottom thereof. A heat conductive piece 9 has two set of heat transfer fins 9a fitting respectively in the two holes 7a in the polymer shell.

The heat conductive piece 9 may be formed of a heat conductive metal, and more preferably, the heat conductive piece 9 is formed of aluminum, an aluminum alloy or zinc. The heat conductive piece 9 is formed by die-casting. As can be seen in FIG. 4, there are upper and lower heat conductive pieces 9. The heat conductive pieces fit in a sealed relationship in the openings 9a. More particularly, two gaskets, 11, 13 are provided for sealing the heat conductive piece 9 to the polymer shell 7. An O-ring gasket 11 fits within a groove formed in the heat conductive piece 9 and against a flat surface of the polymer shell 7. One O-ring gasket 11 surrounds each set of heat transfer fins 9a. The O-ring gasket 11 is for a water tight seal. As can be seen in FIG. 4, the heat conductive piece 9 has an outer lip 9b which fits interior to the polymer shell 7. The O-ring gasket 11 and an electromagnetic radiation gasket 13 both fit between the outer lip 9b and the polymer shell 7. Fasteners 15 hold the heat conductive piece 9 tightly against the polymer shell 7. As can be seen from FIG. 4, a single heat conductive piece 9 is provided for each side of the enclosure.

Each heat conductive piece 9 has a plurality of guide grooves 9c. Printed circuit boards 17 slide in the guide grooves 9c. FIGS. 3 and 5 show card assemblies 19 which include printed circuit boards 17 therein.

Referring to FIG. 4, mounted on a back piece of the enclosure, there are connectors 21 for receiving connectors on the cards 19. Reference numeral 23 is a center support. The center support 23 has guide grooves 23a. Smaller circuit boards slide within the guide grooves 23a on the center support and opposing guide grooves 9c on the heat conductive piece 9. Two power supply boards 25 may be located within the enclosure. Only one power supply board 25 is shown, however. The power supply boards 25 emit substantially more heat than the other circuit boards 17, and the present invention provides for a thermal plane 27 to remove the heat. The thermal plane 27 is formed of a heat conductive material, such as aluminum, an aluminum alloy or zinc. To connect the thermal plane 27 to the power supply board 25, a plurality of rods 29 (one shown) extend between the thermal plane 27 and the power supply board 27, and are screwed into the thermal plane 27 and power supply board 27. The rods 29 can be used alone or in conjunction with a stand off 31. The stand off 31 is formed a rectangular block of heat transfer material (perhaps aluminum kilos) extending between and fastened to the power supply board 25 and thermal plane 27. Note that the connector 21 shown behind the stand off 31 would normally not be visible. The stand off 31, or one or more stand offs 31 could be used in place of the rods 29.

The thermal plane 27 fits within upper and lower widened grooves 33 formed. A thermal clamp 35 (to be described in detail later) transfers heat from the thermal plane 27 to the heat conductive piece 9 and thus enlarges the surface area of heat transfer. Furthermore, the thermal clamp 35 biases the thermal plane against the conductive piece, to the left in FIG. 4. The thermal plane 27 therefore fits tightly against the guide groove, and this also aids in heat transfer. A plurality of cable connectors 37 are provided on the back piece, to the left of the thermal plane 27. Screws 38 attach the back piece to the polymer shell 7.

A copper coating 49 is sprayed on the interior of the polymer shell. Copper coating 49 prevents electromagnetic interference.

Referring to FIGS. 2 and 4, the polymer shell 7 also has a hole 7a for an outer connection piece 39. The connection piece 39 is secured to the polymer shell 7 with gaskets 11 and 13, as can be seen in FIG. 4. Connection piece 39 has broadband service outlets 41 and telephone service outlets 43. Connection piece 39 has a fiber input 45. Aperture 47 in connection piece 39 would normally be sealed, and is for co-axial cable.

As can be seen in FIGS. 2 and 3, the polymer shell is sealed with a cover 51. The cover 51 is gasketed in the same manner as the heat conductive pieces 9 and the outer connection piece 39. The cover 51 has captive fasteners 53 which are retained in the cover 51 even when unscrewed from holes 55 in the polymer shell 7. The polymer shell 7 has hinge extensions 57 which are molded integrally with the polymer shell 7. Hinge portions 59 on the cover 51 receive the hinge extensions 57 on the polymer shell 7.

As described above, the thermal clamp 35 is provided on thermal plane 27. The thermal clamp 35 can be seen in the side view of FIGS. 5a and 5b and in the perspective view of 5c. The thermal clamp 35 includes a shaft 35a, two outer wedges 35b, a center piece 35c and two outer bodies 35d. The outer wedges 35b, center piece 35c and outer bodies 35d all lie on the shaft 35a. Movement of a handle 35e controls the length of the shaft 35a, together with an adjustment mechanism 35f. When outer bodies 35f. When the shaft is shortened, the outer bodies 35d extend away from the outer wedges 35b and center piece 35c, as shown in FIG. 5b. The shaft 35a is bolted or glued to the thermal plane 27. The thermal plane 27 and thermal clamp 35 slide into a widened groove 36 shown in FIG. 5c. Once in the groove, the handle 35e is moved upward to move the outer bodies 35d away from the thermal plane 27 and thereby cause a tight fit between the widened groove 36 and the thermal plane 27. The thermal clamp is formed of an aluminum alloy, with the exception of the adjustment mechanism 35f, which is formed of stainless steel.

While the invention has been described in connection with the preferred embodiments, it will be understood that modifications within the principle outlined above will be evident to those skilled in the art. Thus, the invention is not limited to the preferred embodiments, but is intended to encompass such modifications.

What is claimed is:

1. A circuit board enclosure for housing a plurality of circuit boards, comprising:

a casing having upper and lower openings and an interior; and upper and lower heat conductive pieces separate from the casing, fitting respectively within the upper and lower openings in the casing, in a sealed relationship with the casing, the heat conductive pieces each having an interior side facing the interior of the casing, the interior side supporting one side of the circuit boards.

2. A circuit board enclosure according to claim 1, wherein the interior sides of the upper and lower heat conductive pieces have substantially parallel guide grooves to receive opposing sides of the circuit boards.

3. A circuit board enclosure according to claim 2, wherein the casing has two upper and two lower holes, each heat conductive piece having two sets of heat fins fitting respectively through the two holes in the enclosure.

4. A circuit board enclosure according to claim 1, wherein the casing is formed of polycarbonate.

5. A circuit board enclosure according to claim 1, wherein the heat conductive piece is formed of a heat conductive metal.

6. A circuit board enclosure according to claim 5, wherein the heat conductive piece is formed of aluminum.

7. A circuit board enclosure for housing a plurality of circuit boards, comprising:

a polymer casing having upper and lower openings and an interior; and upper and lower heat conductive pieces formed of a metal and fitting respectively within the upper and lower openings in the casing, in a water tight sealed relationship with the casing, the upper and lower heat conductive pieces having heat transfer fins protruding from the openings in the casing, the upper and lower heat conductive pieces having an interior side facing the interior of the enclosure, the interior sides having guide grooves to receiving opposing sides of the circuit boards, the guide grooves of the upper and lower heat conductive pieces being substantially parallel.

8. A plastic polycarbonate circuit board enclosure according to claim 7, wherein the polymer casing is formed of plastic polycarbonate.

9. A circuit board enclosure according to claim 7, wherein the upper and lower heat conductive pieces are formed of aluminum.

10. A circuit board enclosure according to claim 7, wherein the casing has two upper and two lower holes, each heat conductive piece having two sets of heat transfer fins fitting respectively through the two holes in the casing.

11. A circuit board enclosure according to claim 7, wherein the upper and lower heat conductive pieces have a widened groove having a width wider than that of the guide grooves, the circuit board enclosure further comprising:

a high duty circuit board fitting within guide grooves respectively in the upper and lower heat conductive pieces;

a thermal plane extending parallel to the high duty circuit board;

thermal connectors extending from the high duty circuit board to the thermal plane; and thermal clamps attached to the thermal plane to fit in the widened grooves together with the thermal plane, the thermal clamps having an expandable locking mechanism to secure the thermal plane against the widened groove.

12. A circuit board enclosure according to claim 1, wherein the casing is formed of a polymer and the upper and lower heat conductive pieces are formed of a heat conductive metal.

* * * * *

UNITED STATES PATENT AND TRADEMARK OFFICE
CERTIFICATE OF CORRECTION

PATENT NO.: 5,896,272
DATED : April 20, 1999
INVENTOR(S): Hendrix et al.

It is certified that error appears in the above-identified patent and that said Letters Patent is hereby corrected as shown below:

Col. 5, line 7, after "35f." delete "When outer bodies 35f."

Signed and Sealed this

Twenty-second Day of May, 2001

*Attest:*

NICHOLAS P. GODICI

*Attesting Officer*      *Acting Director of the United States Patent and Trademark Office*